(12) United States Patent
Parker, Jr. et al.

(10) Patent No.: US 6,598,291 B2
(45) Date of Patent: Jul. 29, 2003

(54) VIA CONNECTOR AND METHOD OF MAKING SAME

(75) Inventors: John L. Parker, Jr., Richmond, VA (US); Pamela L. Miscikowski, Richmond, VA (US)

(73) Assignee: Viasystems, Inc., Richmond, VA (US)

( * ) Notice: Subject to any disclaimer, the term of this patent is extended or adjusted under 35 U.S.C. 154(b) by 0 days.

(21) Appl. No.: 09/840,251

(22) Filed: Apr. 23, 2001

(65) Prior Publication Data

US 2002/0043395 A1 Apr. 18, 2002

Related U.S. Application Data

(63) Continuation-in-part of application No. 09/045,615, filed on Mar. 20, 1998, now abandoned.

(51) Int. Cl.[7] ................................................. H05K 3/10
(52) U.S. Cl. .................................. 29/846; 29/852
(58) Field of Search ........................ 29/852, 846, 825, 29/847, 853; 427/97

(56) References Cited

U.S. PATENT DOCUMENTS

| | | | |
|---|---|---|---|
| 3,099,608 A | * 7/1963 | Radovsky et al. ............ 204/15 |
| 3,471,631 A | 10/1969 | Quintana | |
| 3,601,523 A | 8/1971 | Arndt | |
| 4,131,516 A | 12/1978 | Bakos et al. | |
| 4,323,593 A | 4/1982 | Tsunashima et al. | |
| 4,325,780 A | 4/1982 | Schulz, Sr. et al. | |
| 4,383,363 A | 5/1983 | Hayakawa et al. | |
| 4,435,611 A | 3/1984 | Ohsawa et al. | |
| 4,861,641 A | * 8/1989 | Foster et al. ............... 428/137 |
| 4,908,940 A | * 3/1990 | Amano et al. ................ 29/852 |
| 4,911,796 A | 3/1990 | Reed | |
| 5,239,746 A | * 8/1993 | Goldman ...................... 29/840 |
| 5,243,142 A | 9/1993 | Ishikawa et al. | |
| 5,277,787 A | * 1/1994 | Otani et al. .................. 205/125 |
| 5,293,504 A | 3/1994 | Knickerbocker et al. | |
| 5,319,159 A | 6/1994 | Watanabe et al. | |
| 5,340,947 A | 8/1994 | Credle et al. | |
| 5,346,750 A | * 9/1994 | Hatakeyama et al. ....... 428/209 |
| 5,421,083 A | 6/1995 | Suppelsa et al. | |
| 5,435,480 A | 7/1995 | Hart et al. | |
| 5,463,191 A | * 10/1995 | Bell et al. .................... 174/263 |
| 5,473,120 A | 12/1995 | Ito et al. | |
| 5,481,795 A | 1/1996 | Hatakeyama et al. | |
| 5,510,580 A | 4/1996 | Shirai et al. | |
| 5,527,998 A | 6/1996 | Anderson et al. | |
| 5,557,844 A | 9/1996 | Bhatt et al. | |
| 5,571,593 A | 11/1996 | Arldt et al. | |
| 5,585,673 A | 12/1996 | Joshi et al. | |
| 5,662,987 A | 9/1997 | Mizumoto et al. | |
| 5,674,787 A | 10/1997 | Zhao et al. | |
| 5,761,803 A | * 6/1998 | St. John et al. ............... 29/852 |
| 5,879,787 A | 3/1999 | Petefish | |
| 5,958,562 A | 9/1999 | Tsuji et al. | |
| 5,960,538 A | 10/1999 | Kawakita et al. | |
| 5,977,490 A | 11/1999 | Kawakita et al. | |
| 6,079,100 A | * 6/2000 | Farquhar et al. .............. 29/852 |
| 6,195,883 B1 | * 3/2001 | Bhatt et al. ................... 29/852 |
| 6,323,439 B1 | * 11/2001 | Kambe et al. ................ 174/262 |
| 6,418,616 B2 | * 7/2002 | Bhatt et al. ................... 29/852 |
| 2001/0027605 A1 | * 10/2001 | Nabetomoto et al. .......... 29/830 |
| 2002/0016018 A1 | * 2/2002 | Oka et al. ..................... 438/64 |
| 2002/0020557 A1 | * 2/2002 | Nishi et al. .................. 174/262 |
| 2002/0035784 A1 | * 3/2002 | Koyama et al. ............... 29/846 |

\* cited by examiner

*Primary Examiner*—Ira S. Lazarus
*Assistant Examiner*—K. B. Rinehart
(74) *Attorney, Agent, or Firm*—Dunlap, Codding & Rogers

(57) ABSTRACT

An insulator substrate or printed circuit board (PCB) having a filled and plated via. A sidewall of the via and preferably opposite sides of the insulator substrate are first plated with a conductive material. The plated via is then filled with an electrically conductive fill composition. A conductive cap layer is preferably formed over both ends of the conductive fill composition and the opposite surfaces of the insulator substrate, and can be bonded to a surface mount contact as a land or a pad.

28 Claims, 2 Drawing Sheets

VIA CONNECTOR AND METHOD OF MAKING SAME

CROSS-REFERENCE TO RELATED APPLICATION

This is a continuation-in-part of Application Ser. No. 09/045,615 filed Mar. 20, 1998, now abandoned the entire disclosure of which is incorporated herein by reference.

FIELD OF THE INVENTION

The present invention relates in general to printed circuit boards and to methods for fabricating printed circuit boards. More particularly, the present invention relates to printed circuit boards with improved vias which provide electrical communication between wiring patterns formed on two opposing surfaces of a circuit board and/or within the internal strata of the circuit board, and to methods for making improved circuit boards having such vias.

BACKGROUND OF THE INVENTION

Increasing levels of integration of integrated circuit (IC) chips reduces the chip count of a functional circuit, while significantly increasing the input/output (I/O) count of the individual integrated circuits making up the functional circuit. This drive for increased circuit and component density in the individual IC chips leads to a parallel drive for increased circuit and component density in the printed circuit boards carrying the chips and in the assemblies using them.

Typically, a conventional printed wiring board carries ICs as well as other discrete electronic components and circuit elements, which are interconnected to provide the particular electronic circuit functions. In the prior art, those ICs, discrete electronic components, and circuit elements are usually bonded to the printed wiring board using vias or through holes formed in the printed wiring board through which lead wires may be inserted and soldered to the board. However, there have been advances in surface mounting technology widely employed in the printed wiring board manufacturing field. This technology permits an IC to be mounted together with its associated elements on the printed wiring board without forming any through holes or vias in the board. Thus, ICs and other on-chip elements may be mounted on a surface mount land or chip land directly without using the through holes or vias.

To provide for the interconnections between the on-chip elements on the surface mount land on one side and a circuit on the opposite side of, or within, the printed wiring board, the appropriate vias are often provided remotely from the surface mount land, and any wiring pattern required for interconnecting the elements by way of the vias must be formed on the surface of the base plate.

Thus, according to the prior art, the surface mount land or chip land and the vias or through holes are provided at different locations on the printed wiring board. As the size of each of the ICs and other elements is reduced, a corresponding reduction in the size of the surface mount land is required so that required board space is minimized. The wiring pattern that includes leads drawn out from the surface mount land and distributed across different locations must be accordingly fine, but technically, this is practically difficult to achieve. It is also difficult to secure the space required for wiring the leads. In particular, for double-sided high-density wiring pattern implementation, this space limitation poses a problem.

The vias formed in the printed wiring board are exposed on each of the opposite sides of the board. When leads are inserted through the corresponding vias, and the associated circuit components are fixed by the board in solder, surplus solder may flow through the vias, thereby reaching the components on the surface mount land.

In other conventional circuit boards which carry wiring patterns formed on two opposing major surfaces, vias or through holes are formed at desired positions after conductive layers are formed on the entire surface of the opposing major surfaces of the circuit board. Inner surfaces of the thus formed vias are coated with plated layers through the use of a chemical plating method or a chemical/electrical plating method, thereby providing electrical communication between the conductive layers formed on the two major surfaces or internal to the circuit board by way of the plated layers.

The vias are formed through the use of a drilling method or a punching method. Therefore, there is the possibility that the circuit board or the conductive layers become distorted during the formation of the through holes. The thus formed distortion will adversely influence the formation of the plated layers so that an effective electrical connection cannot be achieved between the two conductive layers. In addition, fine wiring patterns cannot be formed near the vias due to the distortion of the conductive layers. Thereafter, the conductive layers are shaped in a desired configuration to obtain wiring patterns formed on both of the major surfaces of the circuit board.

Another example of prior art via connectors is disclosed in U.S. Pat. No. 3,601,523 "THROUGH HOLE CONNECTORS" to Arndt, issued on Aug. 24, 1971, wherein a conductive adhesive is disposed in the through holes or vias for providing electrical communication between the conductive layers formed on both of the major surfaces of the circuit board. In the device of the '523 patent, the vias are formed after the conductive layers are formed on both of the major surfaces of the circuit board and, therefore, there is a possibility that the conductive layers will become distorted near the vias. Moreover, in the '523 patent, electrical communication between the conductive layer and the conductive adhesive is achieved only through the use of the thickness of the conductive layer. In addition, the conductive adhesive is exposed to the ambience. Therefore, the shaping of the wiring patterns must be conducted through the use of a dry film or a resist sheet.

The increased circuit and component density in the printed circuit boards makes the ability to locate either solder surface mount components or place additional circuitry layers directly above conductive vias highly desirable. This is especially the case when the density of the vias required to service the I/O's of the surface mount components is such that there is no surface area available for attachment pads interstitial to the through hole grid.

The problem is especially severe with fine pitch ball grid array components and flip chip attach integrated circuits. Soldering of these surface mount components to the surface pads, i.e., lands, of conventional vias is highly undesirable. This is because the solder used for assembly tends to wick down into the vias. The result is low volume, unreliable solder joints.

One solution that has been proposed is filling the vias. However, known methods of filling vias of printed circuit boards have deficiencies. For example, they suffer from bleed of the resin component of the fill material along the surface of the boards. This resin also bleeds into the holes which are not to be filled. This leads to short circuits and to soldering defects during assembly.

Thus, conductive vias provide an immediate connection from a surface mounted device to the core of a printed circuit board, thereby avoiding inefficient fan out routing patterns that consume space on the outer layers of the multilayer board. These designs, however, present significant assembly problems. Small vias act as entrapment sites for materials that can eventually re-deposit onto the host surface mount land and cause both assembly and reliability problems. Also, these vias act as unintended reservoirs for solder paste that is stenciled onto the surface mount land and used to attached an electronic device to the board. Consequently, an allowance must be made of the solder paste that will be captured by the via and will not be available for the solder joint formed between the device and the board. Typically, the same allowance is made for each via by slightly enlarging the solder paste stencil aperture for each surface mount pad containing a via by some common amount. Because the precise allowance needed varies from via to via, this method leads to an insufficient amount of paste for some lands causing poor solder joints and an over-abundance of solder on others causing solder shorts; both of which unfavorably impact assembly yields.

Another example of prior art via connectors is disclosed in U.S. Pat. No. 5,557,844 "METHOD OF PREPARING A PRINTED CIRCUIT BOARD" to Bhatt et al., issued on Sep. 24, 1996 and assigned to IBM, (referred to herein as "IBM"), wherein a printed circuit board has two types of plated through holes, filled and unfilled. The two types of through holes are formed at different times during the manufacturing process. The through holes that are to be filled are formed first, and the through holes that remain unfilled are later formed using the location of the first through holes for registration. Because all the holes are not formed simultaneously, misregistration of subsequently applied wiring patterns with the holes is likely as a result of tolerance build-ups. Moreover, IBM uses an electroless deposition for the plating of the sidewalls of the through holes, thus limiting the layer thickness to approximately 0.2 mils.

Although the art of vias and through hole connectors on printed circuit boards is well developed, there remain some problems inherent in this technology, particularly the vias and through hole connectors acting as solder reservoirs, thus leading to soldering defects, and the electrical conductivity of the vias. Therefore, a need exists for a via or through hole connector that overcomes the drawbacks of the prior art.

SUMMARY OF THE INVENTION

According to one aspect of the present invention, a method of preparing a printed circuit board (PCB) comprises the steps of forming a hole in a substrate to form a via having a sidewall extending therethrough, depositing a first conductive material on opposite sides of the substrate and on the sidewall of the via, filling the via with a second conductive material to plug the via such that the via has no opening extending completely therethrough in a direction generally perpendicular to the opposite sides of the substrate, and depositing a third conductive material on the first conductive material and on ends of the second conductive material in the via.

According to another aspect of the present invention, a method of making a conductive via in an insulator circuit board substrate adapted to carry wiring patterns on at least a first surface and a second surface thereof comprises the steps of providing an insulator substrate, forming a via having a sidewall in the insulator substrate between the first surface and the second surface by penetrating the insulator substrate, depositing a first conductive layer on the first surface and on the sidewall of the via such that the first conductive layer substantially covers the first surface of the insulator substrate and the sidewall of the via while leaving an opening in the via, depositing a conductive material in the opening of the via to plug the via such that the opening does not extend completely through the via in a direction generally perpendicular to the first and second surfaces, and forming a second conductive layer on the first surface of the insulator substrate subsequent to the forming of the via, the depositing of the first conductive layer, and the depositing of the conductive material in the opening such that the second conductive layer forms a substantially flat surface extending across substantially all of the first conductive layer and across an end portion of the conductive material in the via so that the end portion is covered by and makes direct contact with the second conductive layer.

According to still another aspect of the present invention, a method of preparing a printed circuit board (PCB) comprises the steps of forming a hole on at least one side of a substrate to form a via having a sidewall extending at least partially through the substrate to an internal surface of the substrate, depositing a first conductive material on the one side of the substrate and on the sidewall of the via such that the via has an opening, masking the substrate with a stencil, filling the opening with a second conductive material by moving the second conductive material through an opening in the stencil to plug the via such that the opening in the via does not extend completely through the via in a direction generally perpendicular to the one side of the substrate, and depositing a third conductive material on the first conductive material and on an end of the second conductive material in the opening.

According to yet another aspect of the present invention, a method of preparing a printed circuit board (PCB) comprises the steps of forming a plurality of holes on at least a first surface of a substrate to form a plurality of vias having sidewalls extending at least partially through the substrate to a second surface of the substrate, depositing a first conductive material on at least the first surface of the substrate and on the sidewalls of the vias such that each of the vias has an associated opening, masking the substrate with a stencil to selectively cover a first predetermined number of the vias and reveal a second predetermined number of the vias, filling the openings associated with the revealed vias with a second conductive material, and depositing a third conductive material on the first conductive material and on ends of the second conductive material in the filled openings.

According to a further aspect of the present invention, a circuit board comprises a substrate having at least first and second generally parallel surfaces and a via having a sidewall extending at least partially through the substrate from the first surface to the second surface. A first conductive layer extends over substantially all of the first surface and the via sidewall. A conductive material is positioned within the via and surrounded by the first conductive layer extending over the via sidewall. This conductive material plugs the via such that the via has no opening extending from the first surface to the second surface. A second conductive layer extends over substantially all of the first conductive layer on the first surface, and over an end portion of the conductive material positioned within the via.

According to still a further aspect of the present invention, a circuit board comprises a substrate having at least first and second generally parallel surfaces and a via having a sidewall extending through the substrate from the first surface to the second surface. A first conductive layer extends over substantially all of the first surface, the second surface, and the via sidewall. A conductive material is positioned within the via and surrounded by the first conductive layer extending over the via sidewall. This conductive material plugs the via such that the via has no opening extending from the first surface to the second surface. A second conductive layer extends over substantially all of the first conductive layer on the first surface, and over a first end portion of the conductive material positioned within the via. A third conductive layer extends over substantially all of the first conductive layer on the second surface, and over a second end portion of the conductive material positioned within the via.

Other aspects and features of the present invention will be in part apparent and in part pointed out hereinafter.

BRIEF DESCRIPTION OF THE DRAWING

Corresponding reference characters indicate corresponding features throughout the several views of the drawings.

DESCRIPTION OF EXEMPLARY EMBODIMENTS AND BEST MODE

According to the present invention, an insulator substrate or printed circuit board (PCB) having a filled and plated via is provided. The plated via is filled with an electrically conductive fill composition. A conductive cap layer is formed atop the ends of the filled via and can be bonded to a surface mount contact as a land or a pad.

FIGS. 1A through 1E show fabrication steps of one embodiment of the via connector in accordance with the present invention.

Figure 1A:
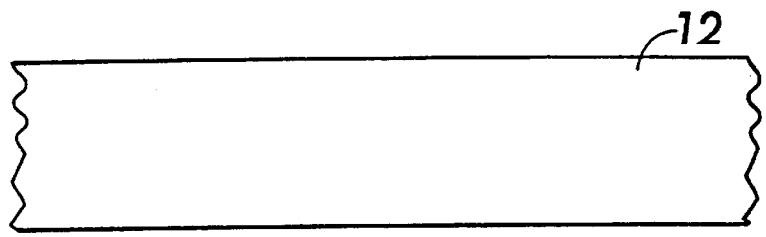
FIGS. 1A through 1E are sectional views of a circuit board substrate and illustrate the fabrication steps of an exemplary via connector in accordance with the present invention.

FIG. 1A shows an insulator substrate 12, such as a printed circuit board or a flexible thin-film substrate. Preferably, the substrate 12 comprises a resin material (in contrast to, for example, ceramic materials), and even more preferably comprises a glass-filled resin material. Some typical glass-filled resin materials suitable for use in the present invention include fiberglass reinforced epoxy resins (e.g., FR4), cyanate ester (e.g., as used in the Gore Speed Board available from Gore Corporation), polyphenylene ether (e.g., as used in the Gigavar brand laminate available from Allied Signal), and epoxy/polyphenylene oxide (e.g., as used in the Getek brand laminate available from General Electric).

Figure 1B:
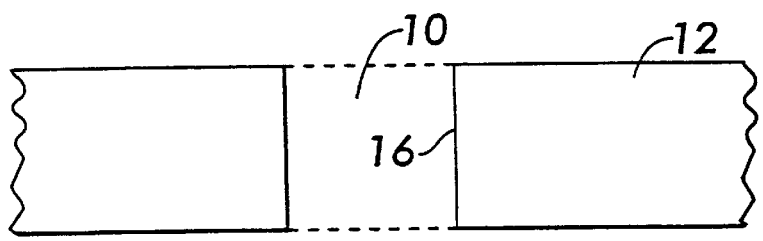

A through hole or via 10 is formed in the insulator substrate 12 at a desired position, as shown in FIG. 1B. Preferably, the via 10 is formed through the use of a drilling method, but any conventional method, such as punching, laser drilling, or photo-definition, can be used. The via 10 can be any diameter, but is preferably in the range between about 2 mils and about 25 mils. Preferably, all or substantially all of the openings or holes in the printed circuit board are formed at the same time, whether they are ultimately to be filled, as described below, or not. This avoids misregistration, especially from tolerance buildups, that can occur between the filled and unfilled vias between the separate hole forming processes and the subsequently formed wiring patterns that are formed by the use of one or more masks that must be registered with the holes. This factor is especially important as PCB wiring patterns become finer and more dense.

Figure 1C:
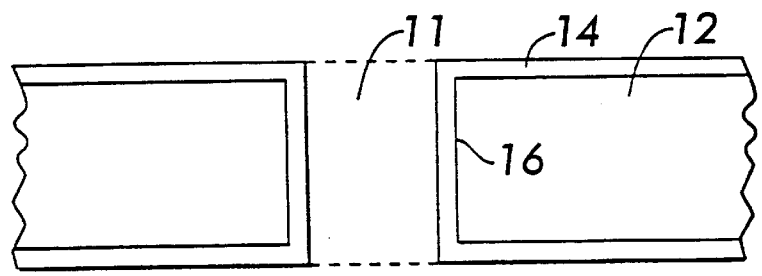

Thereafter, as shown in FIG. 1C, a first conductive layer 14 of a first conductive material is deposited on the surfaces of the substrate 12 and on the sidewalls 16 of the via 10 to leave a via-through-hole 11 in the via 10. Preferably, the first conductive material is copper. The first conductive material is preferably deposited to a thickness in the range between about 0.1 and about 0.8 mils, and more preferably deposited to a thickness of greater than approximately 0.2 mils, and most preferably to a thickness of approximately 0.5 mils. The layer 14 on the sidewalls is preferably thick enough to provide a robust mechanical structure that will survive the thermal fluctuations and aggressive handling experienced by a PCB during subsequent component assembly and usage.

Preferably, an electrolytic plating process is used to deposit the layer 14. The electrolytic process follows a surface preparation step involving either a direct metallization process or an electroless process. The surface preparation step includes depositing a thin conductive layer that sensitizes the surface and assists in the adhesion of the layer 14 to the sidewalls 16. It should be noted that IBM does not use an electrolytic plating process and thus is limited to a conductive layer thickness typical of electroless depositions, which is limited to approximately 0.2 mils. IBM does not use electrolytic plating because a surface preparation step involving depositing a thin conductive layer will either cover the entire pattern, thereby rendering the device inoperable, or involve additional processing steps leading to increased complexity and higher cost.

Direct metallization comprises depositing a thin conductive molecular layer (not shown) on the substrate surfaces and the via sidewalls prior to depositing the layer 14. The conductive layer is preferably palladium or platinum. This process avoids the typical catalytically deposited copper, thereby rendering this device more economically feasible.

The electroless surface preparation process comprises depositing a thin conductive layer (not shown), preferably copper, on the substrate surfaces and the via sidewalls prior to depositing the layer 14, to a thickness in the range between about 30 micro-inches and about 200 micro-inches, and more preferably to a thickness in the range between about 70 micro-inches and about 80 micro-inches.

The surface preparation followed by electrolytic deposition results in a highly linear distribution of the layer 14 on the sidewalls 16 of the via 10.

Figure 1D:
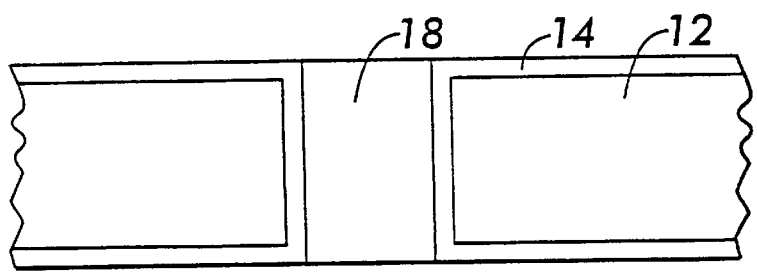

After the sidewalls 16 of the via 10 have been plated with the layer 14, a second conductive material 18, such as a conductive ink, paste, or adhesive, is introduced into the via-through-hole 11 as shown in FIG. 1D. Preferably, the second conductive material 18 is a conductive ink, preferably containing silver, copper, or a noble metal suspended in an epoxy resin, such as CB100, manufactured by E. I. du Pont de Nemours and Company of Wilmington, Del. However, any flowable, curable composition with conductive properties can be used as the second conductive material. The second conductive material 18 is patterned for deposition in the via-through-hole 11 using a stencil or a mask. After the second conductive material 18 is deposited in the via-through-hole 11, the second conductive material 18 is partially or tack cured, and any excess material 18 (usually in the form of a small peak or cap extending above layer 14) is removed by, for example, light mechanical abrasion. Preferably, no conductive material 18, such as ink particles, remains on the layer 14 after the removal process.

The second conductive material 18 is then hard cured. The second conductive material 18 is preferably sufficiently conductive to allow subsequent plating of a conductive cap layer over the filled and plated via 10.

Figure 1E:
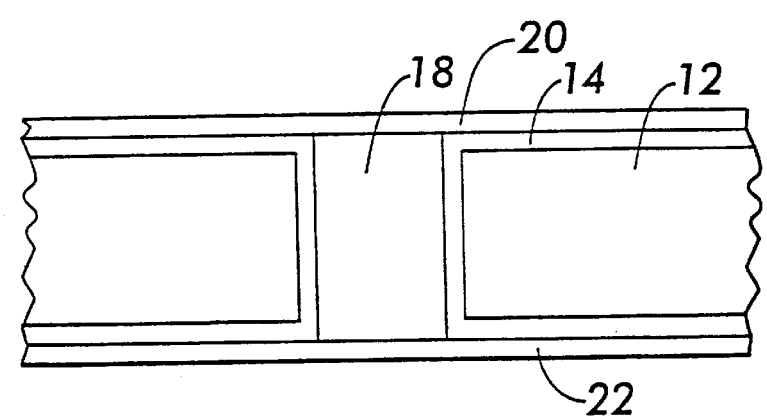

After the second conductive material 18 is cured, layers 20 and 22 of a third conductive material, preferably copper, are formed on both major surfaces, respectively, of the insulator substrate 12 inclusive of both ends of the second conductive material 18, as shown in FIG. 1E. That is, the upper conductive layer 20 and the lower conductive layer 22 extend across the via 10 and are in electrical communication with each other through the second conductive material 18 and the first conductive layer 14. Thus, the via 10 is sealed by the conductive layers 20 and 22, with the conductive layers 20 and 22 acting as a conductive cap.

The conductive layers 20 and 22 can be formed by any conventional process such as attaching a copper film to the substrate or plating a copper layer on the substrate. Preferably, feature plating or panel plating is used to deposit copper to a thickness in the range between about 0.4 mils and about 0.8 mils, and more preferably to a thickness of approximately 0.5 mils.

Thereafter, the conductive layers 14, 20 and 22 are shaped in a desired configuration to obtain desired wiring patterns, through the use of conventional photolithography and print and etch methods, for additive circuitization and solderability.

Because the sidewalls 16 are plated with the first conductive layer 14 prior to introducing the second conductive material 18, the reliability of the electrical connection between the upper conductive layer 20 and the lower conductive layer 22 is increased. Moreover, the layer 14 improves the structural integrity of the connection between the conductive layers 20 and 22 and provides a more robust structure.

In accordance with the present invention, a plurality of vias 10 can be formed concurrently in the insulator substrate 12 at desired positions. During subsequent processing, the vias 10 are filled with the conductive material 18 at the same time, preferably using a stencil. This provides improved registration of the vias and circuit patterns formed on the substrate.

The present invention allows for the conservation and recapture of the conductive fill material 18. Because a stencil is used to fill the via(s), material usage of the conductive fill material is decreased because the stencil captures excess conductive material 18 which can be recovered without contamination, unlike prior methods in which the excess conductive fill material resides on a copper layer which contaminates the conductive fill material, thus rendering it unsuitable for recovery and reuse. These factors are important to manufacturing costs because curable conductive materials tend to be very expensive. Moreover, because a stencil is used to fill the via(s) 10, the present invention provides the advantage of being able to use a higher force on the squeegee blade to fill the via(s) 10 with the conductive fill material 18, an advantage believed to be especially useful to ensure complete filling of blind vias. A higher force can cause the copper surface to scratch. A stencil protects against this damage.

Figure 2:
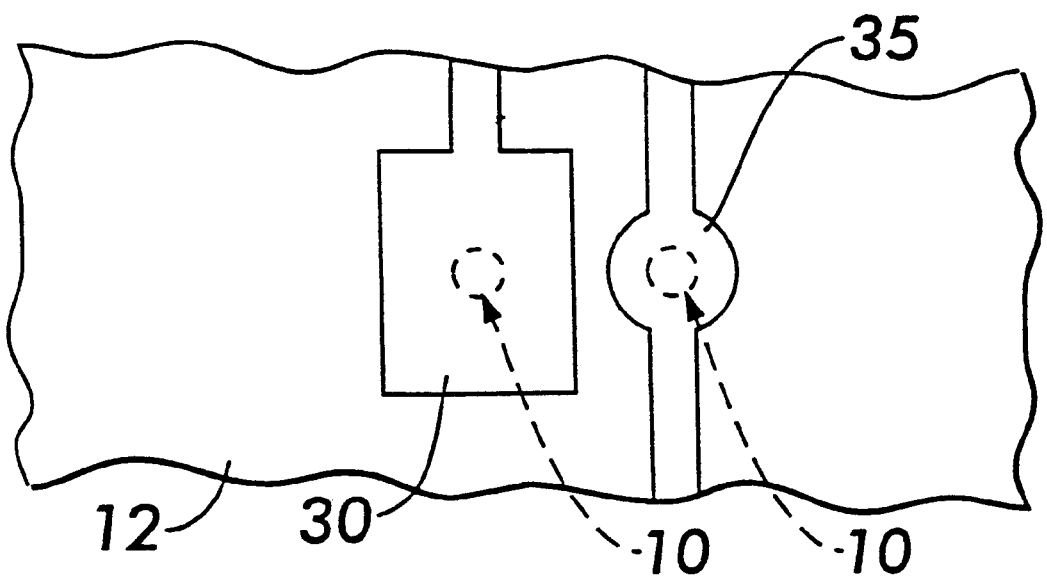
FIG. 2 is a schematic representation showing a surface mount land in plan.

FIG. 2 depicts an exemplary surface mount land 30 aligned with a filled and plated via 10 as well as a pattern 35 aligned with a filled and plated via 10.

The double sided printed wiring board described above allows the surface mount land 30 and a pattern on the opposite side to be electrically conductively interconnected by way of the filled and plated via 10. This eliminates the need of providing a via remotely from the surface mount land 30, and therefore it is not necessary to implement a wiring pattern to interconnect the surface mount land 30 to a remote via. Thus, a high density packing can be realized.

Although the above exemplary embodiments have described vias and methods of making vias between two opposing surfaces of a circuit board or insulator substrate, it is nevertheless intended that the exemplary vias and methods of making vias can also be used to provide electrical communication between wiring patterns formed within the internal surfaces or strata of a circuit board. Moreover, the present invention is equally applicable to blind hole vias, i.e, vias that do not open on both sides of a circuit board. Thus, the present invention can be used to connect a surface of a circuit board with one of the internal strata of the board.

When introducing elements or features of the present invention or the preferred embodiments thereof, the articles "a", "an", "the" and "said" are intended to mean that there are one or more of such elements or features. The terms "comprising", "including" and "having" are intended to be inclusive and mean that there may be additional elements or features other than those listed.

As various changes could be made in the above constructions without departing from the scope of the invention, it is intended that all matter contained in the above description or shown in the accompanying drawings shall be interpreted as illustrative and not in a limiting sense.

What is claimed:

1. A method of preparing a printed circuit board (PCB), comprising the steps of:
    forming a hole in a substrate to form a via having a sidewall extending therethrough;
    depositing a first conductive material on opposite sides of the substrate and on the sidewall of the via;
    filling the via with a second conductive material to plug the via such that the via has no opening extending completely therethrough in a direction generally perpendicular to the opposite sides of the substrate, wherein the second conductive material is a conductive ink; and
    depositing a third conductive material on the first conductive material and on ends of the second conductive material in the via.

2. The method according to claim 1, wherein the step of forming the hole comprises one of drilling the hole, punching the hole, laser drilling the hole, and forming the hole by photo-definition.

3. The method according to claim 1, wherein the first conductive material comprises copper.

4. The method according to claim 3, wherein the step of depositing the first conductive material includes electrolytically depositing the first conductive material to a substantially uniform thickness of greater than approximately 0.2 mils.

5. The method according to claim 4, wherein the substantially uniform thickness is approximately 0.5 mils.

6. The method according to claim 1, further comprising the step of masking the substrate with a stencil to permit selective filling of the via prior to the step of filling the via.

7. The method according to claim 1, further comprising the step of curing the conductive ink prior to the step of depositing the third conductive material.

8. The method according to claim 7, further comprising the step of removing any of the conductive ink extending out of the via prior to the step of depositing the third conductive material.

9. The method according to claim 1, wherein the conductive ink comprises at least one of silver, copper, and a noble metal.

10. The method according to claim 1, wherein the step of depositing the third conductive material comprises one of feature plating and panel plating, and the third conductive material comprises copper.

11. The method according to claim 10, wherein the step of depositing the third conductive material includes depositing the third conductive material to a substantially uniform thickness of between about 0.4 mils and about 0.8 mils.

12. The method according to claim 11, wherein the substantially uniform thickness is approximately 0.5 mils.

13. The method according to claim 1, further comprising the step of depositing a fourth conductive material on the opposite sides of the substrate and on the sidewall of the via prior to the step of depositing the first conductive material.

14. The method according to claim 13, wherein the fourth conductive material comprises one of palladium and platinum.

15. The method according to claim 13, wherein the step of depositing the fourth conductive material includes depositing the fourth conductive material to a substantially uniform thickness of between about 30 micro-inches and about 200 micro-inches.

16. The method according to claim 15, wherein the substantially uniform thickness is between about 70 micro-inches and about 80 micro-inches.

17. The method according to claim 1, wherein the substrate comprises a resin material.

18. The method according to claim 17, wherein the resin material is a glass-filled resin material.

19. The method according to claim 1, further comprising the step of etching the first and third conductive materials so as to form wiring patterns on the opposite sides of the substrate.

20. A method of making a conductive via in an insulator circuit board substrate adapted to carry wiring patterns on an at least a first surface and a second surface thereof, comprising the steps of:

providing an insulator substrate;

forming a via having a sidewall in the insulator substrate between the first surface and the second surface by penetrating the insulator substrate;

depositing a first conductive layer on the first surface and on the sidewall of the via such that the first conductive layer substantially covers the first surface of the insulator substrate and the sidewall of the via while leaving an opening in the via;

depositing a conductive material in the opening of the via to plug the via such that the opening does not extend completely through the via in a direction generally perpendicular to the first and second surfaces, wherein the conductive material is a conductive ink; and forming a second conductive layer on the first surface of the insulator substrate subsequent to the forming of the via, the depositing of the first conductive layer, and the depositing of the conductive material in the opening such that the second conductive layer forms a substantially flat surface extending across substantially all of the first conductive layer and across an end portion of the conductive material in the via so that the end portion is covered by and makes direct contact with the second conductive layer.

21. The method according to claim 20, further comprising the step of etching the first and second conductive layers so as to form a wiring pattern on the first surface of the insulator substrate, the wiring pattern being electrically connected through the via to the second surface.

22. The method according to claim 20, further comprising the step of masking the insulator substrate with a stencil to permit selective filling of the opening prior to the step of depositing the conductive material in the opening, wherein the conductive material is deposited so as to completely fill the opening.

23. The method according to claim 20, wherein the step of depositing the second conductive layer comprises one of feature plating and panel plating and the first and second conductive layers comprise copper.

24. The method according to claim 20, wherein the insulator substrate comprises a glass-filled resin material.

25. A method of preparing a printed circuit board (PCB), comprising the steps of:

forming a hole on at least one side of a substrate to form a via extending at least partially through the substrate to an internal surface of the substrate, the via having a sidewall;

depositing a first conductive material on said one side of the substrate and on the sidewall of the via such that the via has an opening;

masking the substrate with a stencil;

filling the opening with a second conductive material by moving the second conductive material through an opening in the stencil to plug the via such that the opening in the via does not extend completely through the via in a direction generally perpendicular to said one side of the substrate, wherein the second conductive material is a conductive ink; and depositing a third conductive material on the first conductive material and on an end of the second conductive material in the opening.

26. The method according to claim 25, wherein the step of depositing the first conductive material comprises electrolytically plating copper to a substantially uniform thickness exceeding approximately 0.2 mils.

27. A method of preparing a printed circuit board (PCB), comprising the steps of:

forming a plurality of holes on at least a first surface of a substrate to form a plurality of vias extending at least partially through the substrate to a second surface of the substrate, the vias having sidewalls;

depositing a first conductive material on at least the first surface of the substrate and on the sidewalls of the vias such that each of the vias has an associated opening;

masking the substrate with a stencil to selectively cover a first predetermined number of the vias and reveal a second predetermined number of the vias;

filling the openings associated with the revealed vias with a second conductive material, wherein the second conductive material is a conductive ink; and depositing a third conductive material on the first conductive material and on ends of the second conductive material in the filled openings.

28. The method according to claim 27, wherein the step of depositing the first conductive material comprises electrolytically plating copper to a substantially uniform thickness exceeding approximately 0.2 mils.

* * * * *